US007576571B2

(12) United States Patent
Kojima

(10) Patent No.: US 7,576,571 B2
(45) Date of Patent: Aug. 18, 2009

(54) POTENTIAL COMPARATOR AND TEST APPARATUS

(75) Inventor: Shoji Kojima, Tokyo (JP)

(73) Assignee: Advantest Corporation, Tokyo (JP)

( * ) Notice: Subject to any disclaimer, the term of this patent is extended or adjusted under 35 U.S.C. 154(b) by 39 days.

(21) Appl. No.: 11/845,752

(22) Filed: Aug. 27, 2007

(65) Prior Publication Data
US 2008/0218218 A1 Sep. 11, 2008

Related U.S. Application Data

(63) Continuation of application No. PCT/JP2006/303994, filed on Mar. 2, 2006.

(30) Foreign Application Priority Data
Mar. 3, 2005 (JP) .............................. 2005-059408

(51) Int. Cl.
H03K 5/24 (2006.01)
(52) U.S. Cl. .............................. 327/65; 327/63; 327/68
(58) Field of Classification Search .................. None
See application file for complete search history.

(56) References Cited
U.S. PATENT DOCUMENTS
4,241,372 A * 12/1980 Sears .......................... 361/72

4,403,159 A * 9/1983 Goerne et al. .................. 327/85
5,146,154 A * 9/1992 Lippmann et al. ............ 323/367

FOREIGN PATENT DOCUMENTS

| JP | 01-223360 | 9/1989 |
| JP | 09-197018 | 7/1997 |
| JP | 10-319054 | 12/1998 |

* cited by examiner

Primary Examiner—An T Luu
(74) Attorney, Agent, or Firm—Osha • Liang LLP

(57) ABSTRACT

The potential comparator includes input wires 3 and 4 that input a differential signal output from a test object 2, a high-threshold side divided-voltage generating section 5 that acquires the differential signal from each of the input wires 3 and 4 and generates and outputs the first divided voltage and the second divided voltage that are a divided voltage based on a predetermined high threshold potential $V_{OH}$ and an electric potential of the acquired differential signal, a high-threshold side potential comparator 6 that derives a magnitude relation between the first and the second divided voltages output from the high-threshold side divided-voltage generating section 5. The high-threshold side divided-voltage generating section 5 includes a first divided-voltage generating section 16 and a second divided-voltage generating section 17, which respectively generate the first and the second divided voltages of a value in which a magnitude relation between the first and the second divided voltages in the high-threshold side potential comparator 6 corresponds to a magnitude relation between a potential difference between a plus signal and a minus signal and a high threshold potential.

10 Claims, 5 Drawing Sheets

POTENTIAL COMPARATOR AND TEST APPARATUS

CROSS REFERENCE TO RELATED APPLICATION

This is a continuation application of PCT/JP2006/303994 filed on Mar. 2, 2006 which claims priority from a Japanese Patent Application(s) No. 2005-059408 filed on Mar. 3, 2005, the contents of which are incorporated herein by reference.

BACKGROUND

1. Technical Field

The present invention relates to a potential comparator and a test apparatus. More particularly, the present invention relates to a potential comparator that derives a magnitude relation between a potential difference between a pair of signals forming a differential signal output from a test object and a predetermined threshold potential, and a test apparatus.

2. Related Art

Conventionally, there has been known a test apparatus that tests characteristics or the like of an electronic circuit. Specifically, such a test apparatus compares an electrical signal output from the electronic circuit which is a test object with a predetermined threshold voltage by means of a potential comparator, and decides a quality of the electronic circuit on the basis of a comparison result. Therefore, reliability of a test by the test apparatus is largely dependent on comparison precision of the potential comparator that performs electric potential comparison, and thus the potential comparator constituting the test apparatus is extremely important from the viewpoint of the reliability of a test.

Meanwhile, a technique using a so-called differential transmission scheme is proposed instead of a conventional single end transfer, in order to speed up a transfer rate and improve noise tolerance. The differential transmission scheme is a technique performing a signal transfer by means of two transmission lines, and specifically performs a decision of High or Low on the basis of a potential difference between two electrical signals transmitted through two transmission lines. In response to the increase of an electronic circuit using such a differential transmission scheme, realization of a test apparatus including a potential comparator corresponding to a differential transmission scheme is requested even in a field of a test apparatus that performs a characteristic test or the like on the electronic circuit.

As an example of a test apparatus corresponding to a differential transmission scheme, there is an apparatus having a configuration that performs electric potential comparison on each of two electrical signals constituting a differential signal. However, in case of an apparatus with this configuration, there is a problem that the number of potential comparators that are required increases, compared to a test in a single end transfer. Moreover, for example, when common noises get mixed in the respective electrical signals (in other words, when there is not a problem from the viewpoint of signal transmission by the cancel of noises when a potential difference between electrical signals has been derived), the respective electrical signals may have transfer errors, and thus the reliability of a test causes problems.

For this reason, as an example of another test apparatus, there has been known an apparatus that has therein an analog subtracter for deriving a potential difference between input electrical signals and similarly performs potential comparison on a difference signal derived by the analog subtracter and a single end signal. An apparatus having this configuration does not have the above-described problem, and can apply a technique of a potential comparator related to an electronic circuit using a single end transfer method. Moreover, as an example of another test apparatus, there has been known a test apparatus that includes an offset addition section for uniformly changing (offsetting) electric potential of one side of a differential signal and a potential comparator for comparing one electrical signal after the change and the other electrical signal (for example, see Patent Document 1).

[Patent Document 1] Japanese Patent Application Publication No. 1997-197018

However, a conventional test apparatus has a problem that its structure is complicated. In other words, as a concrete structure of an analog subtracter, when a differential signal to be subtracted particularly has a high-speed and wide potential variation range, a degree of difficulty of an electronic circuit constituting a subtracter that favorably maintains linearity is high and a structure thereof becomes complicated.

Moreover, a test apparatus that offsets one electric potential of a differential signal similarly has a complicated structure. In other words, since some kind of feedback mechanism is required from a point of view stabilizing an offset voltage highly, it is necessary that the conventional test apparatus newly has a separate feedback mechanism or the like in addition to a circuit described in FIG. 2 in Patent Document 1, and thus its structure becomes complicated similarly to including an analog subtracter. Moreover, since a test apparatus using an offset addition section has a configuration that the offset addition section includes an emitter-follower as apparent from FIG. 2 in Patent Document 1, there is a problem that a response to a rising edge and a falling edge of a waveform becomes dissymmetric and nonlinearity related to an electrical characteristic of a transistor as a component has an influence on precision of an offset voltage when an input signal is speeded up.

SUMMARY

Therefore, it is an object of some aspects of the present invention to provide a potential comparator and a test apparatus that can solve the foregoing problems. The above and other objects can be achieved by combinations described in the independent claims. The dependent claims define further advantageous and exemplary combinations of the present invention.

That is, according to an aspect related to the innovations herein, one exemplary potential comparator, which derives a magnitude relation between a potential difference between a first and a second signals forming a differential signal and a predetermined threshold potential, may include: a potential comparing section that derives a magnitude relation between two electric potentials that are objects to be compared; a first divided-voltage generating section that generates a first divided voltage that is a divided voltage between a predetermined first electric potential and an electric potential of the first signal and outputs the first divided voltage as one of objects to be compared in the potential comparing section; and a second divided-voltage generating section that generates a second divided voltage, which is a divided voltage between a second electric potential determined on the basis of the first electric potential and the threshold potential and an electric potential of the second signal and in which a magnitude relation between the first divided voltage and the second divided voltage corresponds to the magnitude relation between the potential difference between the first and the second signals and the threshold potential, and outputs the second divided voltage as the other of the objects to be compared in the potential comparing section.

According to an aspect related to the innovations herein, one exemplary test apparatus tests a characteristic of an electronic circuit on the basis of a comparison result by a potential comparator that derives a magnitude relation between a potential difference between a first and a second signals forming a differential signal and a predetermined threshold potential. The potential comparator may include: a potential comparing section that derives a magnitude relation between two electric potentials that are objects to be compared; a first divided-voltage generating section that generates a first divided voltage that is a divided voltage between a predetermined first electric potential and an electric potential of the first signal and outputs the first divided voltage as one of objects to be compared in the potential comparing section; and a second divided-voltage generating section that generates a second divided voltage, which is a divided voltage between a second electric potential determined on the basis of the first electric potential and the threshold potential and an electric potential of the second signal and in which a magnitude relation between the first divided voltage and the second divided voltage corresponds to the magnitude relation between the potential difference between the first and the second signals and the threshold potential, and outputs the second divided voltage as the other of the objects to be compared in the potential comparing section.

The summary does not necessarily describe all necessary features of the present invention. The present invention may also be a sub-combination of the features described above.

DESCRIPTION OF EXEMPLARY
EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

In addition, in an embodiment shown below, although it will be explained about when the potential comparator is used as a component of a test apparatus that tests an electrical characteristic of an electronic circuit for outputting a differential signal, an application of the potential comparator according to the present invention is not limited to the test apparatus.

EMBODIMENT 1

Figure 1:
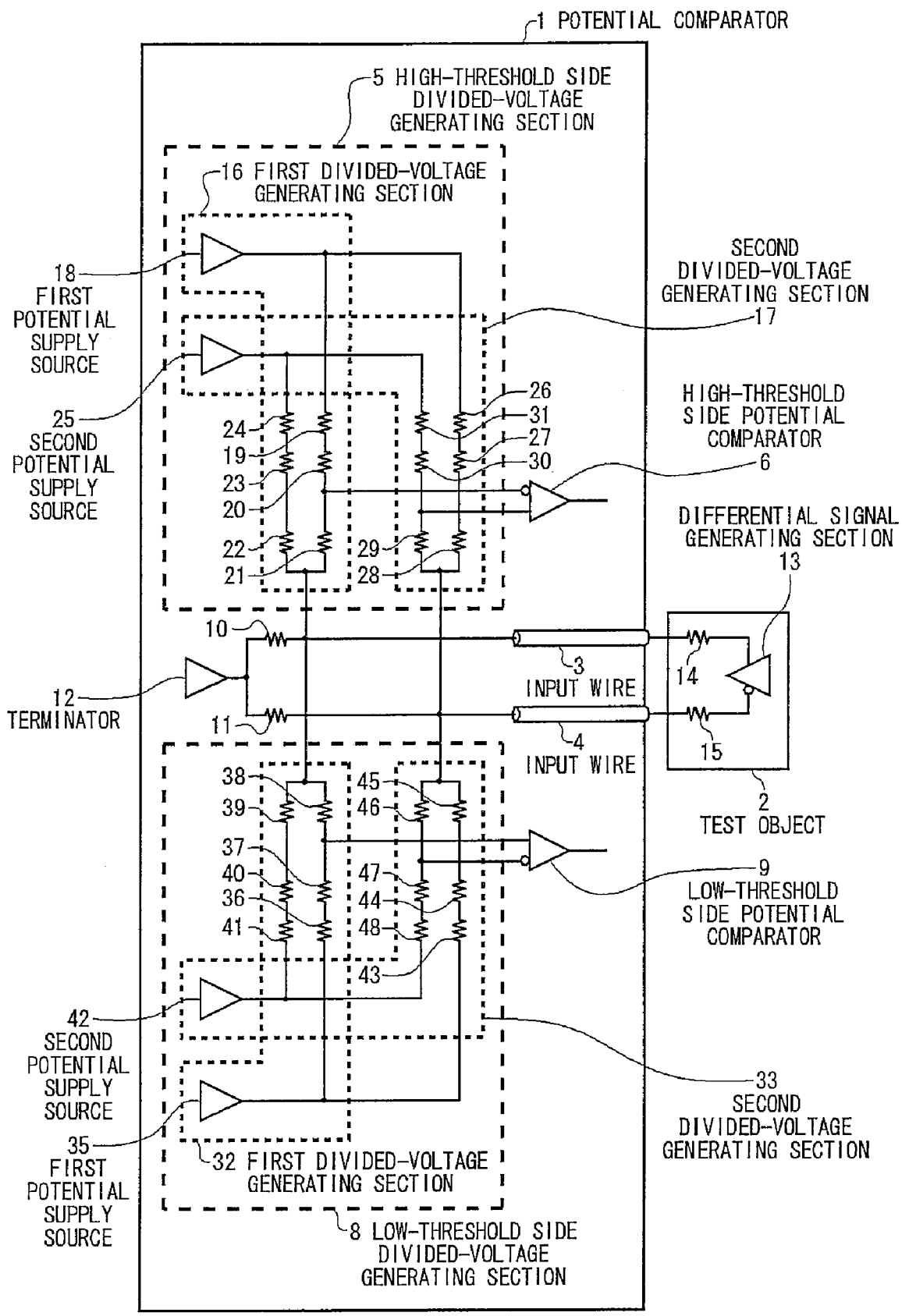
FIG. 1 is a schematic block diagram showing a configuration of a potential comparator according to Embodiment 1.

First, it will be explained about a potential comparator according to Embodiment 1. FIG. 1 is a schematic block diagram showing a configuration of the potential comparator according to the present embodiment 1. As shown in FIG. 1, the potential comparator 1 according to the present embodiment 1 includes input wires 3 and 4 that input signals output from a test object 2, a high-threshold side divided-voltage generating section 5 that acquires the differential signals from the input wires 3 and 4 and generates and outputs a first divided voltage and a second divided voltage that are a divided voltage based on a predetermined high threshold potential $V_{OH}$ and an electric potential of the acquired differential signal, and a high-threshold side potential comparator 6 that derives a magnitude relation between the first and the second divided voltages output from the high-threshold side divided-voltage generating section 5. Moreover, the potential comparator 1 according to the present embodiment 1 includes a low-threshold side divided-voltage generating section 8 that acquires differential signals from the input wires 3 and 4 and generates and outputs a first divided voltage and a second divided voltage that are two types of divided voltages based on a predetermined low threshold potential $V_{OL}$ and an electric potential of the acquired differential signal, and a low-threshold side potential comparator 9 that derives a magnitude relation between the first and the second divided voltages output from the low-threshold side divided-voltage generating section 8. Furthermore, the potential comparator 1 includes resistance elements 10 and 11 of which one end of each is connected to each of the input wires 3 and 4 and a terminator 12 that is connected to the other ends of the resistance elements 10 and 11, in order to match impedances of the high-threshold side divided-voltage generating section 5 and the low-threshold side divided-voltage generating section 8 for the input wires 3 and 4. The terminator 12 is an element for determining a termination voltage from the viewpoint of the test object 2. For purposes of simple description, although it will be below described about when the terminator 12 always generates a termination voltage $V_T$, a voltage generated from the terminator 12 is not limited to the termination voltage $V_T$.

One ends of the input wires 3 and 4 are electrically connected to signal output ports of the test object 2, and the input wires 3 and 4 input a differential signal output from the differential signal generating section 13 provided in the test object 2 into the potential comparator 1. Here, the input wire 3 is electrically connected to a positive pole side of the differential signal generating section 13 provided in the test object 2, and the input wire 4 is electrically connected to a negative pole side of the differential signal generating section 13. For this reason, if required below, it is assumed that a signal input via the input wire 3 is a plus signal (corresponding to a first signal in Claims), a signal input via the input wire 4 is a minus signal (corresponding to a second signal in Claims), and the differential signal is formed of a pair of the plus signal and the minus signal. Moreover, resistance elements 14 and 15 are respectively arranged between the input wires 3 and 4 and the differential signal generating section 13 and inside the test object 2. From a point of view restraining the reflection of differential signal on a boundary portion between the input wires and the test object 2, it is preferable that input impedances of the input wires 3 and 4 are respectively equal to impedances of the resistance elements 14 and 15.

The high-threshold side potential comparator 6 functions as an example of a potential comparing section in Claims. Specifically, the high-threshold side potential comparator 6 receives two electric potentials that are objects to be compared via a positive input side terminal and a negative input side terminal, and outputs High when an electric potential of the positive input side is high and outputs Low when an electric potential of the negative input side is high. In addition, in the present Embodiment 1, the high-threshold side potential comparator 6 utilizes values of a first and a second divided voltages to be input in order to derive a magnitude relation between the first and the second divided voltages output from the high-threshold side divided-voltage generating section 5, and thus has a function deriving a magnitude relation between a potential difference between the plus signal and the minus signal constituting the differential signal and the predetermined high threshold potential $V_{OH}$. The high-threshold side potential comparator 6 may have an arbitrary configuration by which a magnitude relation between two electric potentials to be input can be derived, and can be formed of a well-known comparing circuit.

The high-threshold side divided-voltage generating section 5 generates the first and the second divided voltages that are divided voltages between an electric potential of the differential signal input via the input wires 3 and 4 and an electric potential of a potential supply source included therein, and outputs the generated first and second divided voltages to the high-threshold side potential comparator 6. Specifically, the high-threshold side potential comparator 6 includes a first divided-voltage generating section 16 that generates the first divided voltage that is a divided voltage based on the electric potential of the plus signal (the first signal) that is the differential signal input via the input wire 3 and the high threshold potential $V_{OH}$ that is an example of "a predetermined threshold potential" in Claim, and a second divided-voltage generating section 17 that generates the second divided voltage that is a divided voltage based on the electric potential of the minus signal (the second signal) that is the differential signal input via the input wire 4 and the high threshold potential $V_{OH}$.

The first divided-voltage generating section 16 includes a first potential supply source 18 that supplies a first electric potential of a value obtained by subtracting the high threshold potential $V_{OH}$ from a predetermined reference potential $V_T$, and resistance elements 19 to 24 that respectively have the same electrical resistance value and are serially connected to one another. In a serial connection structure by the resistance elements 19 to 24, an end of the resistance element 19 is electrically connected to the first potential supply source 18, and an end of the resistance element 24 is electrically connected to a second potential supply source 25 (later described). In addition, among the resistance elements 19 to 24, the resistance elements 19 and 20 function as an example of a first resistive part in Claims and the resistance element 21 functions as an example of a second resistive part.

Moreover, a portion at which the resistance element 21 and the resistance element 22 are connect to each other is electrically connected to the input wire 3, and a portion at which the resistance element 20 and the resistance element 21 are connected to each other is electrically connected to the negative input side of the high-threshold side potential comparator 6. For this reason, the first divided-voltage generating section 16 generates the first divided voltage that is a divided voltage between the first electric potential and the electric potential of the plus signal in accordance with a ratio between an electrical resistance value of the resistance elements 19 and 20 (the first resistive part) and an electrical resistance value of the resistance element 21 (the second resistive part), and outputs the generated first divided voltage to the negative input side of the high-threshold side potential comparator 6. In addition, the termination voltage from the viewpoint of the test object 2 deviates from $V_T$ because the resistance elements 19 to 21 connected to the first potential supply source 18 are connected to the input wire 3. However, the resistance elements 22 to 24 connected to the second potential supply source 25 (later described) are connected to the input wire 3 in order to remove this deviance. Moreover, as described below, it is preferable that the resistance elements 19 to 24 and 10 connected to the input wire 3 and resistance elements 36 to 41 to be described below are matched with a characteristic impedance of the input wire 3 as a whole.

The second divided-voltage generating section 17 includes a second potential supply source 25 that supplies a second electric potential of a value obtained by adding the reference potential $V_T$ and the high threshold potential $V_{OH}$, and the resistance elements 26 to 31 that respectively has the same electrical resistance value and are serially connected to one another. In addition, among the resistance elements 26 to 31, the resistance elements 30 and 31 function as an example of a third resistive part in Claims, and the resistance element 29 functions as an example of a fourth resistive part. Moreover, in a serial connection structure formed by the resistance elements 26 to 31, an end of the resistance element 31 is electrically connected to the second potential supply source 25 and an end of the resistance element 26 is electrically connected to the first potential supply source 18. Moreover, a portion at which the resistance element 28 and the resistance element 29 are connected to each other is electrically connected to the input wire 4, and a portion at which the resistance element 29 and the resistance element 30 are connected to each other is electrically connected to the positive input side of the high-threshold side potential comparator 6. For this reason, the second divided-voltage generating section 17 generates the second divided voltage that is a divided voltage between the second electric potential and the electric potential of the minus signal in accordance with a ratio between an electrical resistance value of the resistance elements 30 and 31 (the third resistive part) and an electrical resistance value of the resistance element 29 (the fourth resistive part), and outputs the generated second divided voltage to the positive input side of the high-threshold side potential comparator 6. In addition, the termination voltage from the viewpoint of the test object 2 deviates from $V_T$ because the resistance elements 29 to 31 connected to the second potential supply source 25 are connected to the input wire 4. However, the resistance elements 26 to 28 connected to the first potential supply source 18 are connected to the input wire 4 in order to remove this deviance. Moreover, as described below, it is preferable that the resistance elements 26 to 31 and 11 connected to the input wire 4 and resistance elements 43 to 48 to be described below are matched with a characteristic impedance of the input wire 4 as a whole.

Next, it will be described about the low-threshold side divided-voltage generating section 8 and the low-threshold side potential comparator 9. From the viewpoint of constituting a potential comparator, it is preferable that the potential comparator includes either of a pair of the high-threshold side divided-voltage generating section 5 and the high-threshold side potential comparator 6 or a pair of the low-threshold side divided-voltage generating section 8 and the low-threshold side potential comparator 9. However, it is assumed that the potential comparator according to the present Embodiment 1 as described above is used in a test apparatus that performs a characteristic test on the test object 2 for outputting a differential signal as a use aspect. For this reason, in the present Embodiment 1, in addition to the high-threshold side divided-voltage generating section 5 and the high-threshold side potential comparator 6 that perform electric potential comparison corresponding to the high threshold potential $V_{OH}$, the potential comparator includes the low-threshold side divided-voltage generating section 8 and the low-threshold side potential comparator 9 that perform electric potential comparison corresponding to a low threshold potential $V_{OL}$ that is another example of "a predetermined threshold potential" in Claims.

The low-threshold side potential comparator 9 functions as an example of a potential comparing section in Claims similarly to the high-threshold side potential comparator 6.

In regard to a concrete configuration, the low-threshold side potential comparator is similar to the high-threshold side potential comparator 6, and can be constituted of a general comparing circuit.

The low-threshold side divided-voltage generating section 8 has a function for generating and outputting the first and the second divided voltages using a predetermined threshold potential and an electric potential of differential signal (a plus signal and a minus signal) similarly to the high-threshold side divided-voltage generating section 5. The low-threshold side divided-voltage generating section 8 includes the first divided-voltage generating section 32 and the second divided-voltage generating section 33 that respectively generate and output a predetermined divided voltage similarly to the high-threshold side divided-voltage generating section 5, but has a configuration different from that of the high-threshold side divided-voltage generating section 5 in terms of assuming that a threshold potential used for generating a divided voltage is the low threshold potential $V_{OL}$ having a value lower than the high threshold potential $V_{OH}$ used in the high-threshold side divided-voltage generating section 5.

The first divided-voltage generating section 32 has a first potential supply source 35 that supplies a predetermined electric potential and resistance elements 36 to 41 that respectively have the same electrical resistance value and are serially connected to one another. Among the resistance elements 36 to 41, the resistance elements 36 and 37 function as an example of the first resistive part in Claims and the resistance element 38 functions as an example of the second resistive part. In a serial connection structure by the resistance elements 36 and 41, an end of the resistance element 36 is electrically connected to the first potential supply source 35 and an end of the resistance element 41 is electrically connected to the second potential supply source 42 (later described). Moreover, a connected portion between the resistance elements 38 and 39 is electrically connected to the input wire 3, and a connected portion between the resistance elements 37 and 38 is electrically connected to a positive input side of the low-threshold side potential comparator 9. The above-mentioned basic configuration is similar to that of the first divided-voltage generating section 16 provided in the high-threshold side divided-voltage generating section 5.

A point conspicuously different from a configuration of the first divided-voltage generating section 16 is that an electric potential supplied by the first potential supply source 35 becomes a value obtained by subtracting the low threshold potential $V_{OL}$ from the predetermined reference potential $V_T$.

The second divided-voltage generating section 33 has the second potential supply source 42 that supplies a predetermined electric potential and resistance elements 43 to 48 that respectively have the same electrical resistance value and are serially connected to one another. Among the resistance elements 43 to 48, the resistance elements 47 and 48 function as an example of the third resistive part in Claims and the resistance element 46 functions as an example of the fourth resistive part. In a serial connection structure by the resistance elements 43 and 48, an end of the resistance element 43 is electrically connected to the first potential supply source 35 and an end of the resistance element 48 is electrically connected to the second potential supply source 42. Moreover, a connected portion between the resistance elements 45 and 46 is electrically connected to the input wire 4, and a connected portion between the resistance elements 46 and 47 is electrically connected to a negative input side of the low-threshold side potential comparator 9. A point conspicuously different from the second divided-voltage generating section 17 provided in the high-threshold side divided-voltage generating section 5 is that an electric potential supplied by the second potential supply source 42 becomes a value obtained by adding the low threshold potential $V_{OL}$ to the predetermined reference potential $V_T$.

Next, it will be described about cross-correlation between electrical resistance values of the resistance elements 10 and 11 connected to the terminator 12 and the resistance elements 19 to 24, 26 to 31, 36 to 41, and 43 to 48 provided in the high-threshold side divided-voltage generating section 5 and the low-threshold side divided-voltage generating section 8. The potential comparator 1 for inputting a differential signal that is an alternating current signal via the input wires 3 and 4 requires impedance matching between the input wires 3 and 4 and the other components so that the differential signal is not reflected on a connected portion between the input wires 3 and 4 and the other components. For this reason, in the present Embodiment 1, from a point of view realizing the impedance matching, assuming that electrical resistance values of the resistance elements 19 to 24, 26 to 31, 36 to 41, and 43 to 48 are the same value Ra and electrical resistance values of the resistance elements 10 and 11 are Rb, values of Ra and Rb are determined so that Expression (1) is accomplished for impedance Zo of the input wires 3 and 4.

$$Zo=(3RaRb)/(4Rb+3Ra) \qquad \text{Expression (1)}$$

Next, it will be described about an operation of the potential comparator 1 according to the present Embodiment 1. As described above, the potential comparator 1 according to the present Embodiment 1 derives a magnitude relation between a potential difference between the plus signal (the first signal) and the minus signal (the second signal) forming the differential signal and a predetermined threshold potential. Specifically, the potential comparator 1 according to the present Embodiment 1 derives a magnitude relation between the high threshold potential $V_{OH}$ and the potential difference between the differential signals by means of the first divided-voltage generating section 16 and the second divided-voltage generating section 17 provided in the high-threshold side divided-voltage generating section 5 and the high-threshold side potential comparator 6, and derives a magnitude relation between the low threshold potential $V_{OL}$ and the potential difference between the differential signals by means of the first divided-voltage generating section 32 and the second divided-voltage generating section 33 provided in the low-threshold side divided-voltage generating section 8 and the low-threshold side potential comparator 9. Since derivation of magnitude relation in both is performed on the basis of a substantially similar principle, it will be below described with a focus on an operation of the high-threshold side divided-voltage generating section 5 and the high-threshold side potential comparator 6.

As described above, the high-threshold side divided-voltage generating section 5 has the first divided-voltage generating section 16 and the second divided-voltage generating section 17, and each generates a predetermined divided voltage and outputs the generated divided voltage to the high-threshold side potential comparator 6. In the first divided-voltage generating section 16, the resistance element 19 is electrically connected to the first potential supply source 18 that supplies the first electric potential ($V_T$–$V_{OH}$), and a connected portion between the resistance element 21 and the resistance element 22 is electrically connects to the input wire 3 into which the plus signal of one of the differential signal is input. For this reason, when using an electric potential $V_{uP}$ of the plus signal, a first divided voltage $V_{HN}$ that is a divided voltage at a connected portion between the resistance elements 20 and 21 in a serial connection structure that is formed of the resistance elements 19 and 20 (the first resistive part) and the resistance element 21 (the second resistive part) having the same electrical resistance value Ra is expressed by Expression (2).

$$V_{HN}=\{2RaV_{uP}+Ra(V_T-V_{OH})\}/3Ra=(2V_{uP}+V_T-V_{OH})/3 \quad \text{Expression (2)}$$

Since a connected portion between the resistance elements 20 and 21 is electrically connected to the negative input side of the high-threshold side potential comparator 6, the first divided voltage $V_{HN}$ expressed by Expression (1) becomes a negative input of the high-threshold side potential comparator 6.

The second divided-voltage generating section 17 also generates a divided voltage by a similar principle. In other words, both ends of the serial connection structure by the resistance elements 29 to 31 constituting the second divided-voltage generating section 17 are electrically connected to the second potential supply source 25 that supplies an electric potential ($V_T$+$V_{OH}$) and the input wire 4 that inputs the minus signal of the other of the differential signal. For this reason, in the serial connection structure consisting of the resistance elements 30 and 31 (the third resistive part) having the same resistance value Ra and the resistance element 29 (the fourth resistive part), the second divided voltage $V_{HP}$ that is a divided voltage at a connected portion between the resistance elements 29 and 30 is expressed with Expression (3) similarly to the case of Expression (2).

$$V_{HP}=(2V_{uN}+V_T+V_{OH})/3 \quad \text{Expression (3)}$$

As described above, since a connected portion between the resistance elements 29 and 30 is electrically connected to a positive input side of the high-threshold side potential comparator 6, the second divided voltage $V_{HP}$ shown in Expression (3) becomes a positive input of the high-threshold side potential comparator 6.

In this manner, since the second divided voltage $V_{HP}$ shown in Expression (3) is input into a positive input of the high-threshold side potential comparator 6 and the first divided voltage $V_{HN}$ shown in Expression (2) is input into a negative input thereof, the high-threshold side potential comparator 6 directly derives a magnitude relation between the second divided voltage $V_{HP}$ and the first divided voltage $V_{HN}$. In other words, the high-threshold side potential comparator 6 determines whether $\Delta V$ expressed by Expression (4) is larger.

$$\Delta V=V_{HP}-V_{HN} \quad \text{Expression (4)}$$

However, when substituting right hand sides of Expression (2) and Expression (3), Expression (4) is transformed into Expression (5).

$$\Delta V=\{(2V_{uN}+V_T+V_{OH})/3\}-\{(2V_{uP}+V_T-V_{OH})/3\}=-(2/3)\{(V_{uP}-V_{uN})-V_{OH}\} \quad \text{Expression (5)}$$

The right hand side of Expression (5) derived by expression transformation is obtained by multiplying a differential value between a differential signal ($V_{uP}$–$V_{uN}$) between the plus signal and the minus signal forming the differential signal and the high threshold potential $V_{OH}$ that is an example of "a predetermined threshold potential" in Claims by (–2/3).

Therefore, a derivation result of a magnitude relation between the second divided voltage $V_{HP}$ and the first divided voltage $V_{HN}$ by the high-threshold side potential comparator 6 corresponds to a magnitude relation between a potential difference between a plus signal and a minus signal forming a differential signal and a threshold potential, as shown in Expression (5). As a result, since the potential comparator 1 according to the present Embodiment 1 refers to a result derived by the high-threshold side potential comparator 6, it is possible to make clear the magnitude relation between the potential difference between the first signal (the plus signal) and the second signal (the minus signal) forming the differential signal output from the test object and the predetermined threshold potential. As a result, the high-threshold side potential comparator 6 outputs Low when a potential difference between the differential signals is larger than the high threshold potential and outputs High when the potential difference is smaller than the high threshold potential. A user can recognize a magnitude relation between both on the basis of the output result.

Such an operation is also similar in the low-threshold side divided-voltage generating section 8 and the low-threshold side potential comparator 9. In other words, in the first divided-voltage generating section 32, the first divided voltage $V_{LP}$ as a divided voltage between the first electric potential ($V_T$–$V_{OL}$) supplied from the first potential supply source 35 by actions of the resistance elements 36 and 37 (the first resistive part) and the resistance element 38 (the second resistive part) and the electric potential $V_{uP}$ of the plus signal is expressed with Expression (6).

$$V_{LP}=(2V_{uP}+V_T-V_{OL})/3 \quad \text{Expression (6)}$$

In the second divided-voltage generating section 33, the second divided voltage $V_{LN}$ as a divided voltage between the second electric potential ($V_T$+$V_{OL}$) supplied from the second potential supply source 42 by actions of the resistance elements 47 and 48 (the third resistive part) and the resistance element 46 (the fourth resistive part) and the electric potential $V_{uN}$ of the minus signal is expressed with Expression (7).

$$V_{LN}=(2V_{uN}+V_T+V_{OL})/3 \quad \text{Expression (7)}$$

Therefore, the low-threshold side potential comparator 9 derives a magnitude relation between $\Delta V'$ and zero, in which $\Delta V'$ is defined as Expression (8).

$$\Delta V'=V_{LP}-V_{LN}=(2/3)(V_{uP}-V_{uN}-V_{OL}) \quad \text{Expression (8)}$$

As clear from the most right hand side of Expression (8), a derivation result corresponds to a magnitude relation between a potential difference between a plus signal and a minus signal forming a differential signal and a low threshold potential that is another example of "a predetermined threshold potential" in Claims. Specifically, the low-threshold side potential comparator 9 outputs High when a potential difference between differential signals is larger than a low threshold potential and outputs Low when the potential difference is smaller than the low threshold potential.

Next, it will be described about an advantage of the potential comparator according to the present Embodiment 1. First, the potential comparator according to the present Embodiment 1 generates the suitable first and second divided voltages between electric potentials determined according to a predetermined threshold potential in the first divided-voltage generating section 16 and the second divided-voltage generating section 17 (or the first divided-voltage generating section 32 and the second divided-voltage generating section 33) and derives a magnitude relation between the first divided voltage and the second divided voltage, in order to derive a magnitude relation between a potential difference between differential signals and a predetermined threshold potential. In this manner, in the present Embodiment 1, since electric potential comparison can be performed by using a predetermined potential supply source, resistance elements, and an existing comparing circuit, it is possible to realize a potential comparator with a simple circuit structure compared to a conventional potential comparator using an analog subtracter or the like.

Moreover, an electrical characteristic of resistance elements constituting a potential comparator does not ideally depend on an absolute value of an electric potential and a frequency. Therefore, unlike with a conventional potential comparator, the potential comparator can adequately correspond to a differential signal having a wide potential range and a high speed (in other words, high frequency), and perform high-precise electric potential comparison regardless of a frequency or the like of the differential signal.

Furthermore, the potential comparator according to the present Embodiment 1 is formed by elements with the same electrical resistance value in regard to the resistance elements 19 to 24, 26 to 31, 36 to 41, and 43 to 48. For this reason, when manufacturing the potential comparator according to the present Embodiment 1, since two kinds of resistance elements having electrical resistance values Ra and Rb that satisfy relation of Expression (1) are prepared, the potential comparator with a simple structure can be realized from the viewpoint of the type of the resistance element and thus a manufacturing cost can be reduced.

Moreover, since the resistance elements 19 to 24 can use elements with the same electrical resistance value, the resistance elements 19 to 24 can have the same physical structure. When the same structure is used, the resistance elements have the same change for an electric characteristic such as the change of an electrical resistance value by a temperature change and constantly hold a ratio between electrical resistance values, regardless of the change of a peripheral environmental condition such as temperature. In the present Embodiment 1, as described above, since a divided voltage is generated on the basis of a ratio between electrical resistance values between the resistance elements, although an electrical resistance value in an individual resistance element is changed due to the change of a peripheral environmental condition, the potential comparator can perform high-precise electric potential comparison by holding a ratio between electrical resistance values.

ALTERNATIVE EXAMPLE 1

Next, it will be described about Alternative Example 1 of the potential comparator according to Embodiment 1. In the present Alternative Example 1, similarly to Embodiment 1, the potential comparator that compares a potential difference between differential signals with a plurality of threshold potentials has a configuration forming the high-threshold side divided-voltage generating section 5 and the low-threshold side divided-voltage generating section 8 in Embodiment 1 in a integrated fashion, when relation of Expression (9) is accomplished between the high threshold potential $V_{OH}$ and the low threshold potential $V_{OL}$.

$V_{OH} = -V_{OL}$ Expression (9)

Figure 2:
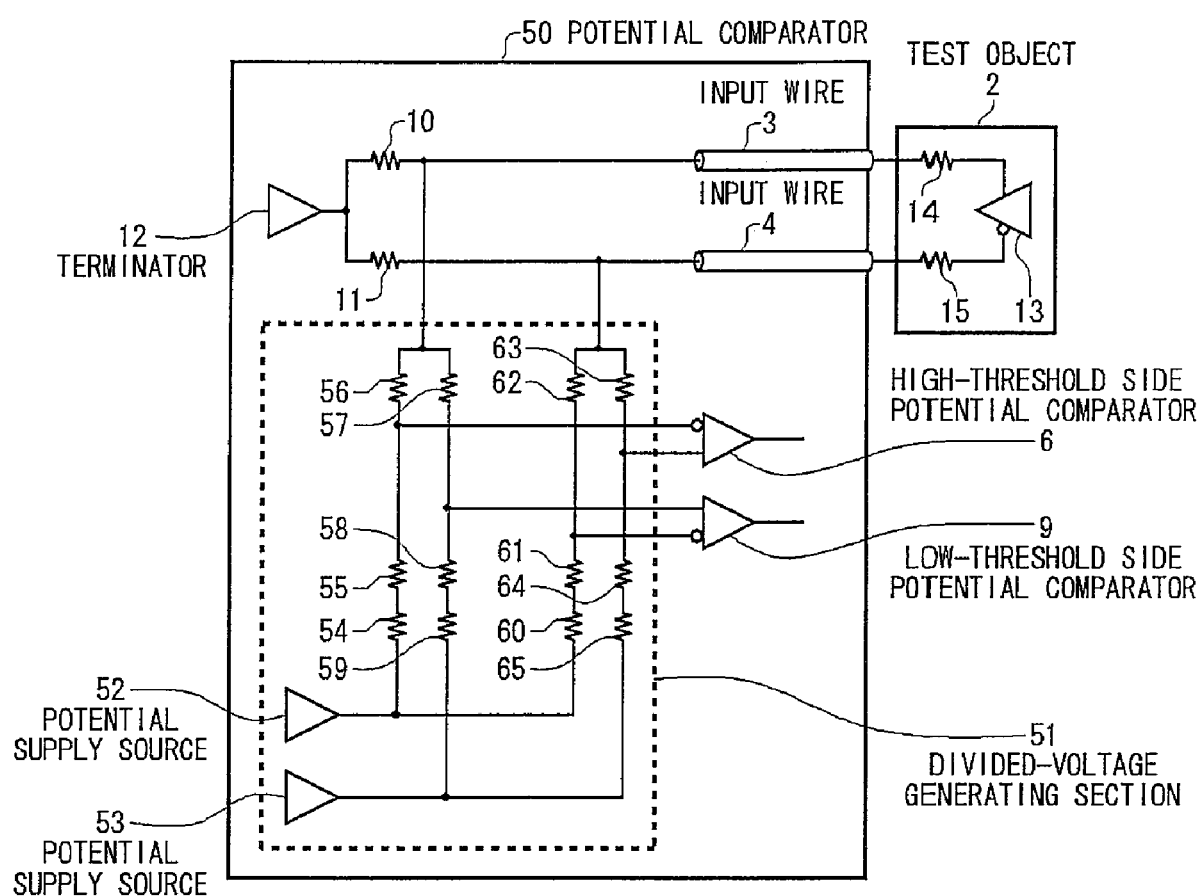
FIG. 2 is a schematic block diagram showing a configuration of a potential comparator according to Alternative Example 1 of Embodiment 1.

FIG. 2 is a schematic block diagram showing a configuration of a potential comparator 50 according to the present Alternative Example 1. As shown in FIG. 2, the potential comparator 50 according to the present Alternative Example 1 includes input wires 3 and 4, resistance elements 10 and 11, a high-threshold side potential comparator 6, and a low-threshold side potential comparator 9 similarly to Embodiment 1. Further, the potential comparator 50 newly has a divided-voltage generating section 51 that has functions of the high-threshold side divided-voltage generating section 5 and the low-threshold side divided-voltage generating section 8 in Embodiment 1.

The divided-voltage generating section 51 has a potential supply source for supplying a predetermined electric potential and a resistance element having a predetermined electrical resistance value similarly to the high-threshold side potential comparator 6 or the like in Embodiment 1. Specifically, the divided-voltage generating section 51 includes a potential supply source 52 that supplies an electric potential obtained by subtracting the high threshold potential $V_{OH}$ from the predetermined reference potential $V_T$ and a potential supply source 53 that supplies an electric potential obtained by adding the high threshold potential $V_{OH}$ to the reference potential $V_T$. Then, a serial connection structure of resistance elements 54 to 59 and a serial connection structure of resistance elements 60 to 65 are arranged between the potential supply source 52 and the potential supply source 53, ends of the resistance element 54 side and the resistance element 60 side of the respective serial connection structures are electrically connected to the potential supply source 52, and ends of the resistance element 59 side and the resistance element 65 side are electrically connected to the potential supply source 53.

In the serial connection structure of the resistance elements 54 to 59, a connected portion between the resistance elements 55 and 56 is electrically connected to a negative input side of the high-threshold side potential comparator 6, a connected portion between the resistance elements 56 and 57 is electrically connected to the input wire 3, and a connected portion between the resistance elements 57 and 58 is electrically connected to a positive input side of the low-threshold side potential comparator 9. Moreover, in the serial connection structure of the resistance elements 60 and 65, a connected portion between the resistance elements 61 and 62 is electrically connected to a negative input side of the low-threshold side potential comparator 9, a connected portion between the resistance elements 62 and 63 is electrically connected to the input wire 4, and a connected portion between the resistance elements 63 and 64 is electrically connected to a positive input side of the high-threshold side potential comparator 6.

In addition, the resistance elements 54 to 65 are formed of resistance elements having the same electrical resistance value. Moreover, it is preferable that in regard to an electrical resistance value Rc of the resistance elements 54 to 65, an impedance value of other components within the potential comparator 50 viewed from the input wires 3 and 4 side is equal to an input impedance value of the input wires 3 and 4 from the viewpoint of impedance matching. For this reason, an electrical resistance value Rc of the resistance elements 54 to 65 is determined so that Expression (10) is accomplished between electrical resistance values Rb of the resistance elements 10 and 11 for an impedance Zo of the input wires 3 and 4.

$Zo = (3RcRb)/(2Rb + 3Rc)$ Expression (10)

Assuming that the impedance Zo and the electrical resistance value Rb are fixed, as is apparent from comparison with Expression (1), the electrical resistance value Rc of the resistance elements 54 to 65 becomes (½) of an electrical resistance value Ra of the resistance element 19 or the like.

This reason is that the number of resistance elements provided in the divided-voltage generating section 51 becomes one-half in comparison with the number of resistance elements provided in the high-threshold side divided-voltage generating section 5 and the low-threshold side divided-voltage generating section 8 in Embodiment 1, as is apparent from comparison between FIG. 1 and FIG. 2.

Next, it will be described about an operation of the divided-voltage generating section 51 for two threshold potentials (a high threshold potential and a low threshold potential). When performing electric potential comparison using the high threshold potential $V_{OH}$ as a threshold potential, namely, electric potential comparison by the high-threshold side potential comparator 6, the potential supply source 52 functions as a substitute of the first potential supply source 18 in Embodiment 1 and the resistance elements 54 to 56 function as substitutes of the resistance elements 19 to 21. Therefore, an electric potential of a connection section between the resistance elements 55 and 56 becomes a first divided voltage $V_{HN}$ shown in Expression (2), and the first divided voltage is output to the negative input side of the high-threshold side potential comparator 6. On the other hand, the potential supply source 53 functions as a substitute of the second potential supply source 25 in Embodiment 1 and the resistance elements 63 to 65 function as substitutes of the resistance elements 29 to 31. For this reason, an electric potential of a connection section between the resistance elements 63 and 64 becomes a second divided voltage $V_{HP}$ shown in Expression (3), and the second divided voltage is output to the positive input side of the high-threshold side potential comparator 6.

For this reason, similarly to Embodiment 1, the high-threshold side potential comparator 6 is supplied with the first divided voltage $V_{HN}$ shown in Expression (2) via the negative input side and is supplied with the second divided voltage $V_{HP}$ shown in Expression (3) via the positive input side. Therefore, the high-threshold side potential comparator 6 can derive a magnitude relation between a potential difference between a plus signal and a minus signal forming a differential signal and the high threshold potential $V_{OH}$ on the basis of Expressions (4) and (5).

Next, it will be described about when performing electric potential comparison using the low threshold potential $V_{OL}$ ($=-V_{OH}$) as a threshold potential, namely, electric potential comparison by the low-threshold side potential comparator 9. The potential supply source 53 functions as a substitute of the first potential supply source 35 in Embodiment 1, and the resistance elements 57, 58, and 59 function as substitutes of the resistance elements 38, 37, and 36. Therefore, an electric potential of a connection section between the resistance elements 57 and 58 becomes the first divided voltage $V_{LP}$ shown in Expression (6), and the first divided voltage is output to the positive input side of the low-threshold side potential comparator 9. On the other hand, the potential supply source 52 functions as a substitute of the second potential supply source 42 in Embodiment 1, the resistance elements 60, 61, and 62 function as substitutes of the resistance elements 48, 47, and 46, and an electric potential of a connection section between the resistance elements 61 and 62 becomes the second divided voltage $V_{LN}$ shown in Expression (7). For this reason, electric potentials input into the positive input side and the negative input side of the low-threshold side potential comparator 9 respectively become the first divided voltage $V_{LP}$ and the second divided voltage $V_{LN}$, and as shown in Expression (8), a magnitude relation between a potential difference between a plus signal and a minus signal forming a differential signal and the low threshold potential $V_{OL}$.

In this manner, when relation shown in Expression (9) is accomplished between the high threshold potential $V_{OH}$ and the low threshold potential $V_{OL}$, the number of the potential supply source and the resistance elements can become substantially one-half as shown in the present Alternative Example 1, and thus the potential comparator with a simpler structure can be realized.

ALTERNATIVE EXAMPLE 2

Next, it will be described about Alternative Example 2 of the potential comparator according to Embodiment 1. The potential comparator according to the present Alternative Example 2 can derive a magnitude relation between a potential difference between a plus signal and a minus signal forming a differential signal and many threshold potentials on the basis of a configuration shown in Alternative Example 1.

Figure 3:
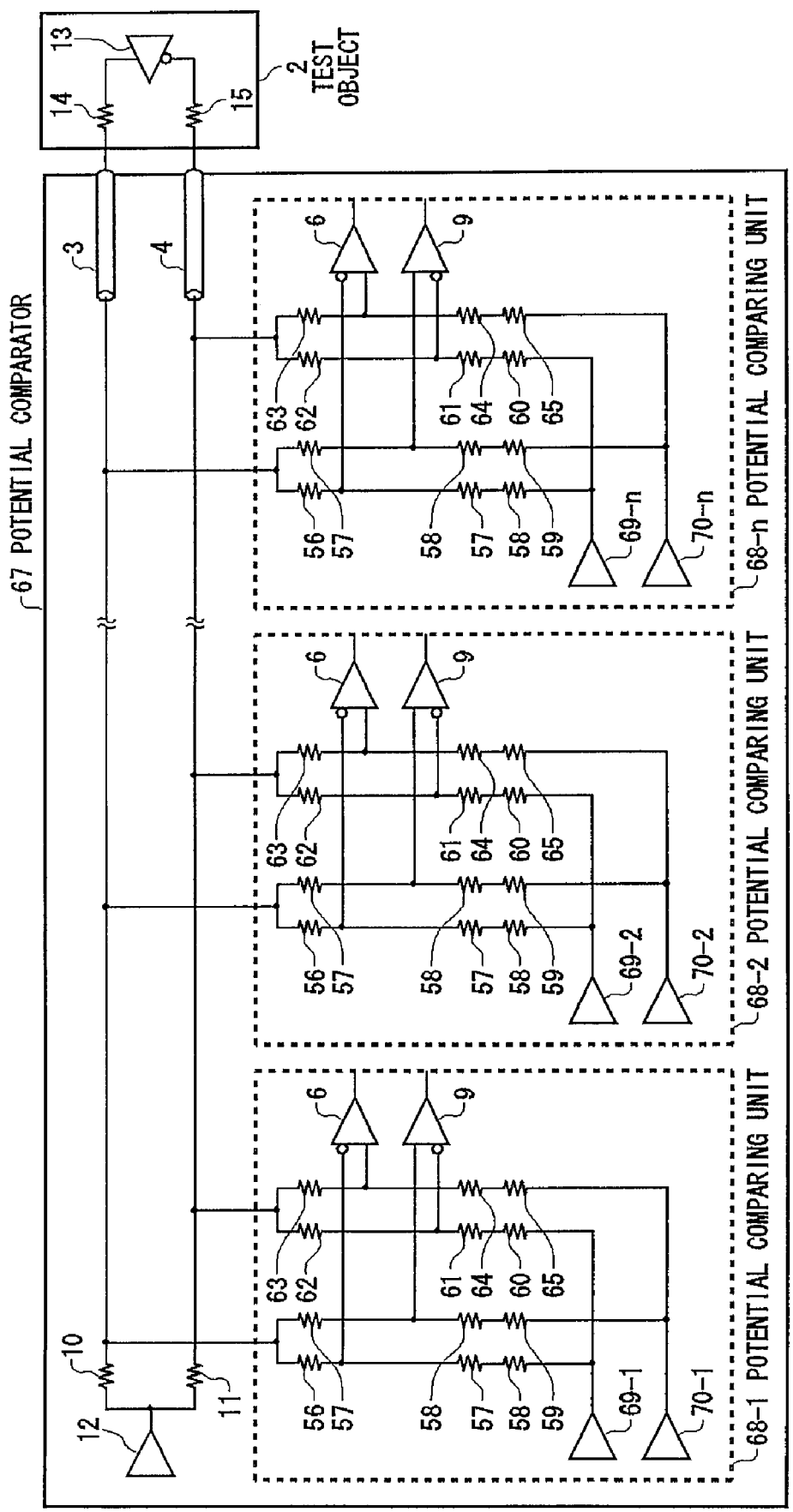
FIG. 3 is a schematic block diagram showing a configuration of a potential comparator according to Alternative Example 2 of Embodiment 1.

FIG. 3 is a schematic block diagram showing a configuration of a potential comparator according to the present Alternative Example 2. As shown in FIG. 3, the potential comparator 67 according to the present Alternative Example 2 includes potential comparing units 68-1 to 68-n (n: two or more natural number) having a configuration similar to that of the divided-voltage generating section 51, the high-threshold side potential comparator 6, and the low-threshold side potential comparator 9 in Alternative Example 1, in addition to input wires 3 and 4, resistance elements 10 and 11, and a terminator 12.

The potential comparing units 68-1 to 68-n basically have a configuration similar to that obtained by combining the divided-voltage generating section 51, the high-threshold side potential comparator 6, and the low-threshold side potential comparator 9. On the other hand, the potential comparing units are formed so that a high threshold potential and a low threshold potential used as a threshold potential become a value different from each other, and electric potentials supplied by the potential supply sources 69-1 to 69-n and 70-1 to 70-n corresponding to the difference of threshold potential are different from one another.

Specifically, the potential comparing unit 68-1 sets the high threshold potential to $V_{OH1}$ and the low threshold potential to $-V_{OH1}$, the potential comparing unit 68-2 sets the high threshold potential to $V_{OH2}$ and the low threshold potential to $-V_{OH2}$, and the potential comparing unit 68-n sets the high threshold potential to $V_{OHn}$ and the low threshold potential to $-V_{OHn}$. Corresponding to the difference of the threshold potentials in the supply electric potentials of the potential supply sources 69-1 to 69-n and 70-1 to 70-n, for example, an electric potential supplied by the potential supply source 69-1 becomes a value obtained by subtracting the high threshold potential $V_{OH1}$ from the predetermined reference potential $V_T$, and an electric potential supplied by the potential supply source 69-2 becomes a value obtained by subtracting the high threshold potential $V_{OH2}$ from the reference potential $V_T$.

Next, it will be described about advantage of the potential comparator according to the present Alternative Example 2. The potential comparator according to the present Alternative Example 2 includes a plurality of potential comparing units 68 corresponding to a plurality of threshold potentials as described above. Therefore, the potential comparator according to the present Alternative Example 2 can derive a magnitude relation between a potential difference between a plus signal and a minus signal forming a differential signal output from the test object 2 and a plurality of threshold potentials.

For this reason, when using the potential comparator according to the present Alternative Example 2 as a part of a test apparatus, for example, detailed eye pattern evaluation can be performed on the differential signal output from the test object 2. The eye pattern evaluation is to evaluate signal characteristics by means of analyzing a time change pattern of a differential signal. Conventionally, the eye pattern evaluation has been for example performed by means of observing a signal waveform by oscilloscope or the like.

On the other hand, the potential comparator according to the present Alternative Example 2 can derive a magnitude relation between a potential difference between a plus signal and a minus signal forming a differential signal and a plurality of threshold potentials. Since the potential difference between the plus signal and the minus signal is continuously changed, the potential difference between the plus signal and the minus signal becomes identical with the threshold potential at the moment at which the magnitude relation is reversed. For this reason, since many threshold potentials are set and a mechanism for detecting a timing at which the magnitude relation between the potential difference and the threshold potential is reversed is provided, a time change of the potential difference between the plus signal and the minus signal forming the differential signal can be detected and characteristic evaluation such as eye pattern evaluation can be performed with high accuracy. Moreover, since the potential comparator according to the present Alternative Example 2 can be formed of only the potential supply source and the resistance elements unlike with an oscilloscope or the likes, a characteristic test such as eye pattern evaluation can be performed with a simple structure.

EMBODIMENT 2

Next, it will be described about a potential comparator according to Embodiment 2. The potential comparator according to the present Embodiment 2 has a basic configuration equal to that of the potential comparator in Embodiment 1, and has a configuration excepting the resistance elements 10 and 11 and the terminator 12 unlike with Embodiment 1.

Figure 4:
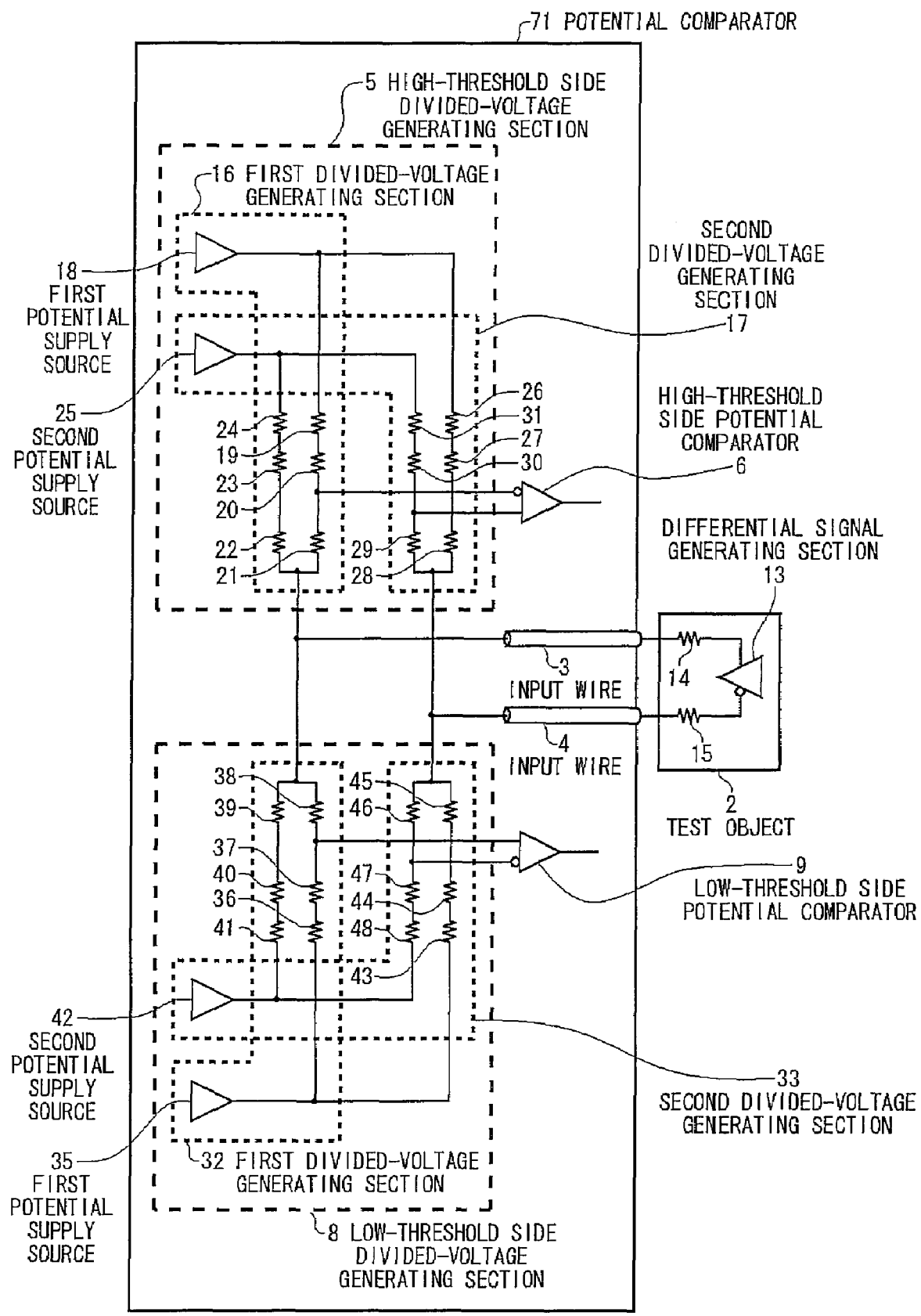
FIG. 4 is a schematic block diagram showing a configuration of a potential comparator according to Embodiment 2.

FIG. 4 is a schematic block diagram showing a configuration of the potential comparator according to the present Embodiment 2. As shown in FIG. 4, the potential comparator 71 according to the present Embodiment 2 includes input wires 3 and 4, a high-threshold side divided-voltage generating section 5, a high-threshold side potential comparator 6, a low-threshold side divided-voltage generating section 8, and a low-threshold side potential comparator 9 similarly to Embodiment 1, and has a configuration excepting the resistance elements 10 and 11 and the terminator 12 in Embodiment 1.

As described even in Embodiment 1, an electrical resistance value Ra of the resistance element 19 or the like and an electrical resistance value Rb of the resistance elements 10 and 11 have relation shown in Expression (1) so that impedance matching for an impedance Zo of the input wires 3 and 4 is realized in order to restrain or prevent a differential signal from being reflected on a boundary portion between the input wires 3 and 4 and the high-threshold side potential comparator 6 or the like.

Here, relation of Expression (11) is accomplished when deriving a limit using a value of Rb as infinity with respect to a right hand side of Expression (1).

$$Z_0 = \lim_{Rb \to \infty} \frac{3RaRb}{4Rb+3Ra} = \frac{3Ra}{4} \quad \text{Expression (11)}$$

For this reason, impedance matching can be realized when using a value of the electrical resistance value Rb as infinity, namely, omitting the resistance elements 10 and 11. Specifically, it is possible to realize a potential comparator that excepts the resistance elements 10 and 11 and the terminator 12 and realizes impedance matching by means of determining the electrical resistance value Ra of the resistance element 19 or the like so as to satisfy Expression (11). By having this configuration, the potential comparator according to the present Embodiment 2 can realize the potential comparator with a further simple configuration.

EMBODIMENT 3

Next, it will be described about a potential comparator according to Embodiment 3. The potential comparator according to the present Embodiment 3 is obtained by expanding a concept of Embodiment 1, and is obtained by generalizing relation between a ratio of a resistance value between the first and the second resistive parts and an electric potential of a potential supply source for generating a divided voltage.

Figure 5:
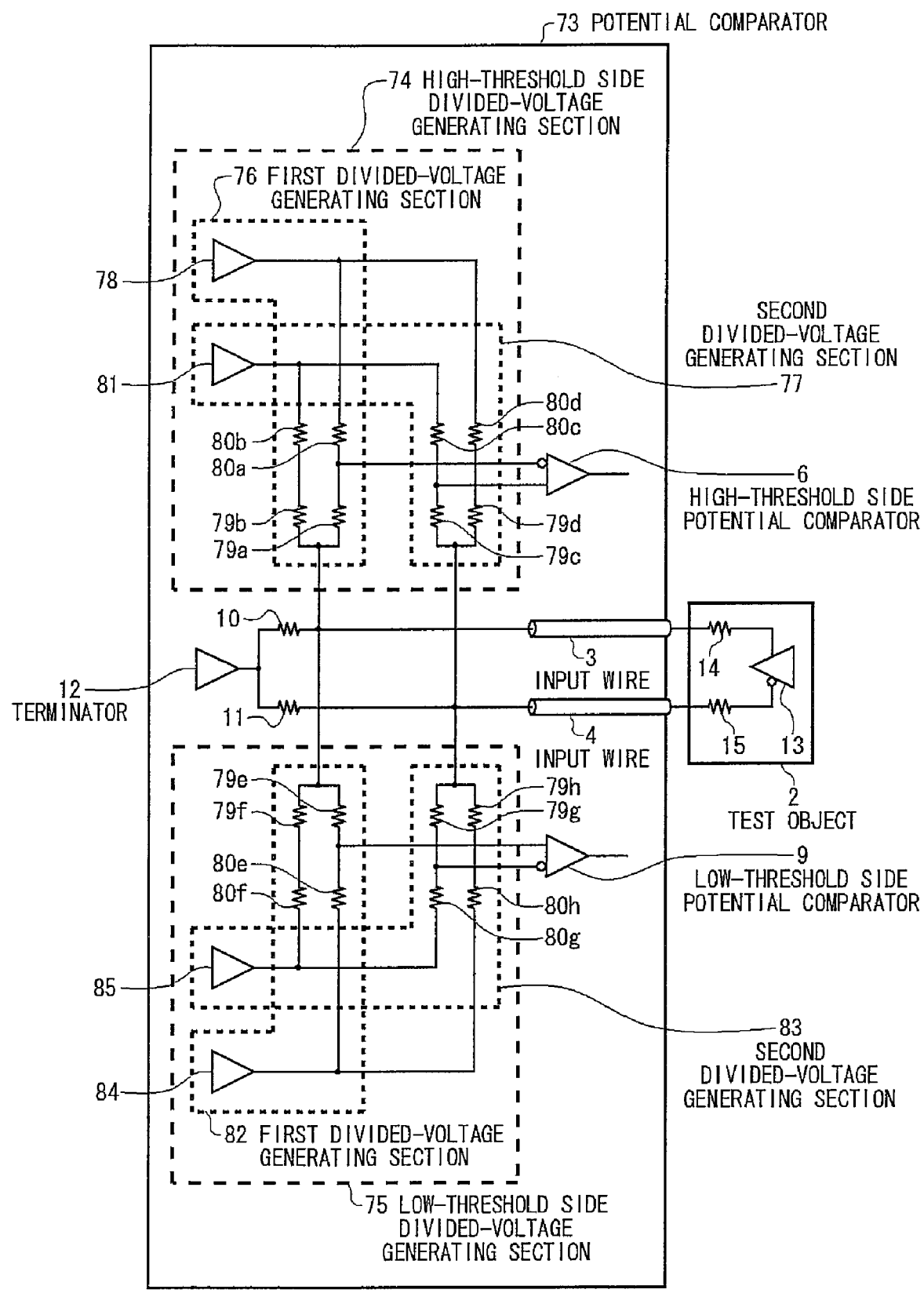
FIG. 5 is a schematic block diagram showing a configuration of a potential comparator according to Embodiment 3.

FIG. 5 is a schematic block diagram showing a configuration of the potential comparator 73 according to the present Embodiment 3. As shown in FIG. 5, the potential comparator according to the present Embodiment 3 includes input wires 3 and 4, a high-threshold side potential comparator 6, a low-threshold side potential comparator 9, resistance elements 10 and 11, and a terminator 12 similarly to Embodiment 1, and also includes a high-threshold side divided-voltage generating section 74 that generates a predetermined divided voltage and outputs the same to the high-threshold side potential comparator 6 and a low-threshold side divided-voltage generating section 75 that generates a predetermined divided voltage and outputs the same to the low-threshold side potential comparator 9, which have a configuration different from that of the high-threshold side divided-voltage generating section 5 and the low-threshold side divided-voltage generating section 8 in Embodiment 1.

The high-threshold side divided-voltage generating section 74 includes a first divided-voltage generating section 76 and a second divided-voltage generating section 77. The first divided-voltage generating section 76 includes a first potential supply source 78 that supplies a first electric potential and resistance elements 80*a*, 79*a*, 79*b*, and 80*b*. Here, the resistance element 80*a* functions as an example of the first resistive part in Claims and the resistance element 79*a* functions as an example of the second resistive part. Moreover, the first potential supply source 78 is electrically connected to an end of the resistance element 80*a* side in a serial connection structure formed by the resistance elements 80*a*, 79*a*, 79*b*, and 80*b* that are connected to one another sequentially and serially. In addition, an end of the resistance element 80*b* side in the serial connection structure is electrically connected to the second potential supply source 81 to be described below. Moreover, a connected portion between the resistance elements 80*a* and 79*a* is electrically connected to a negative input side of the high-threshold side potential comparator 6, and a connected portion between the resistance elements 79*a* and 79*b* is electrically connected to the input wire 3.

The second divided-voltage generating section 77 includes a second potential supply source 81 that supplies a second electric potential and resistance elements 80*c*, 79*c*, 79*d*, and 80*d*. Here, the resistance element 80*c* functions as an example of the third resistive part in Claims, and the resistance element 79*c* functions as an example of the fourth resistive part. Moreover, the second potential supply source 81 is electrically connected to an end of the resistance element 80*c* side in a serial connection structure formed by the resistance elements 80*c*, 79*c*, 79*d*, and 80*d* that are connected to one another sequentially and serially. In addition, an end of the resistance element 80d side in the serial connection structure is electrically connected to the first potential supply source 78. Moreover, a connected portion between the resistance elements 80c and 79c is electrically connected to a positive input side of the high-threshold side potential comparator 6, and a connected portion between the resistance elements 79c and 79d is electrically connected to the input wire 4.

Next, it will be described about relation between values of the first electric potential and the second electric potential supplied by the first potential supply source 78 and the second potential supply source 81 constituting the high-threshold side divided-voltage generating section 74 and electrical resistance values of the resistance element 80a (the first resistive part), the resistance element 79a (the second resistive part), the resistance element 80c (the third resistive part), and the resistance element 79c (the fourth resistive part). In the present Embodiment 3, the respective electrical resistance values are determined so that a ratio between the electrical resistance value of the resistance element 80a and the electrical resistance value of the resistance element 79a is at least equal to a ratio between the electrical resistance value of the resistance element 80c and the electrical resistance value of the resistance element 79c. In the present Embodiment 3, from the viewpoint of simplifying a configuration in addition to such a condition, the resistance elements are formed so that the resistance elements 80a to 80d have an electrical resistance value Re and the resistance elements 79a to 79d have an electrical resistance value Rd, and a resistance ratio between the resistance elements 80a and 79a (the resistance elements 80c and 79c) becomes Re:Rd.

Moreover, the first electric potential and the second electric potential are determined so that a value obtained by subtracting the first electric potential from the second electric potential is equal to a value obtained by multiplying a value, which is obtained by dividing an electrical resistance value of the resistance element 79a (the resistance element 79c) by an electrical resistance value of the resistance element 80a (the resistance element 80c), by the high threshold potential. In other words, the first electric potential $V_1$ and the second electric potential $V_2$ are set to satisfy relation of Expression (12) by means of the electrical resistance value Rd of the resistance element 79a, the electrical resistance value Re of the resistance element 80a, and the high threshold potential $V_{OH}$.

$$V_2 - V_1 = (Re/Rd) V_{OH} \quad \text{Expression (12)}$$

In addition, in the present Embodiment 3, relation shown in Expression (12) is satisfied by means of setting concrete values of the first electric potential $V_1$ and the second electric potential $V_2$ as described below.

$$V_1 = V_T - (Re/2Rd) V_{OH} \quad \text{Expression (13)}$$

$$V_2 = V_T + (Re/2Rd) V_{OH} \quad \text{Expression (14)}$$

Next, it will be described about values of a first divided voltage $V_{HN}'$ output from the first divided-voltage generating section to the negative input side of the high-threshold side potential comparator 6 and a second divided voltage $V_{HP}'$ output from the second divided-voltage generating section to the positive input side of the high-threshold side potential comparator 6. Similarly to the case of Embodiment 1, these divided voltages are determined on the basis of electric potentials $V_{uP}$ and $V_{uN}$ of a plus signal and a minus signal in the input wires 3 and 4, the first electric potential $V_1$ and the second electric potential $V_2$ satisfying a condition of Expression (12), the electrical resistance value Re of the resistance elements 80a and 80c, and the electrical resistance value Rd of the resistance elements 79a and 79c. In other words, similarly to the cases of Expressions (2) and (3), $V_{HN}'$ and $V_{HP}'$ are obtained with Expression (15) and Expression (16).

$$V_{HN}' = (ReV_{uP} + RdV_1)/(Rd+Re) \quad \text{Expression (15)}$$

$$V_{HP}' = (ReV_{uN} + RdV_2)/(Rd+Re) \quad \text{Expression (16)}$$

Then, since the first divided voltage $V_{HN}'$ is output to the negative input side of the high-threshold side potential comparator 6 and the second divided voltage $V_{HP}'$ is output to the positive input side of the high-threshold side potential comparator 6, the high-threshold side potential comparator 6 determines whether a value of $\Delta V'$ shown in Expression (17) is larger than zero, and outputs High when the value is larger than zero and outputs Low when the value is smaller than zero.

$$\Delta V' = V_{HP}' - V_{HN}' \quad \text{Expression (17)}$$

When substituting Expressions (15), (16), and (12) for Expression (17), Expression (18) is accomplished.

$$\Delta V' = (Rd+Re)^{-1} \{Re(V_{uN} - V_{uP}) + Rd(V_2 - V_1)\} = \{-Re/(Rd+Re)\}\{(V_{uP} - V_{uN}) - V_{OH}\} \quad \text{Expression (18)}$$

Relation shown in Expression (18) is similar to Expression (5) in Embodiment 1. The high-threshold side potential comparator 6 can derive a magnitude relation between the first divided voltage and the second divided voltage to be input, in order to derive a magnitude relation between a potential difference between a plus signal and a minus signal forming a differential signal and a high threshold potential.

The low-threshold side divided-voltage generating section 75 is also similar to the case of the high-threshold side divided-voltage generating section 74. In other words, the low-threshold side divided-voltage generating section 75 includes a first divided-voltage generating section 82 and a second divided-voltage generating section 83. In the first divided-voltage generating section 82, an end of the resistance element 80e side in a serial connection structure formed by the resistance elements 80e, 79e, 79f, and 80f is electrically connected to the first potential supply source 84, an end of the resistance element 80f side is electrically connected to the second potential supply source 85 (later described), a connected portion between the resistance elements 79e and 79f is electrically connected to the input wire 3, and a connected portion between the resistance elements 79e and 80e is electrically connected to the positive input side of the low-threshold side potential comparator 9. Moreover, in the second divided-voltage generating section 83, an end of the resistance element 80g side in a serial connection structure formed by the resistance elements 80g, 79g, 79h, and 80h is electrically connected to the second potential supply source 85, an end of the resistance element 80h side is electrically connected to the first potential supply source 84, a connected portion between the resistance elements 79g and 79h is electrically connected to the input wire 4, and a connected portion between the resistance elements 80g and 79g is electrically connected to the negative input side of the low-threshold side potential comparator 9.

Relation between electrical resistance values of these components and a supply electric potential is also determined similarly to the high-threshold side divided-voltage generating section 74. In other words, in order to satisfy the condition that an electrical resistance value ratio between the resistance elements 79e and 80e and an electrical resistance value ratio between the resistance elements 79g and 80g are made equal, the resistance elements 79e to 79h are formed to have the same electrical resistance value Rd and the resistance elements 80e to 80h is formed to have the same electrical resistance value Re. Moreover, in the first potential supply source 84 and the second potential supply source 85, the first electric potential $V_1'$ and the second electric potential $V_2'$ are determined so that relation of replacing the high threshold potential $V_{OH}$ by the low threshold potential $V_{OL}$ is accomplished in Expressions (12) to (14). In this manner, in the low-threshold side divided-voltage generating section 75, relation of Expressions (12) to (18) related to the high-threshold side divided-voltage generating section 74 is accomplished in a manner of replacing the high threshold potential $V_{OH}$ by the low threshold potential $V_{OL}$. As a result, the low-threshold side potential comparator 9 derives a magnitude relation between the first divided voltage and the second divided voltage to be input so as to derive a magnitude relation between a potential difference between a plus signal and a minus signal forming a differential signal and a low threshold potential.

In this manner, if constant relation is satisfied between the first electric potential and the second electric potential and electrical resistance values of resistance elements, electric potential comparison can be performed even in configurations other than the configuration shown in Embodiment 1, and thus an advantage similar to that of Embodiment 1 can be obtained. Moreover, since the potential comparator according to the present Embodiment 3 can arbitrarily determine electrical resistance values of resistance elements and electric potentials supplied from the first and the second potential supply sources if the above-described relation is satisfied, degrees of freedom of design are improved.

As above, although the present invention has been described by way of Embodiments 1 to 3 and Alternative Example, it should be understood that those skilled in the art might make many changes and substitutions without departing from the spirit and the scope of the present invention. For example, a potential comparator made by combining concepts between different embodiment and alternative example can be realized. For example, a potential comparator according to Embodiment 3 can adopt a configuration excepting the resistance elements 10 and 11 and the terminator 12 similarly to Embodiment 2.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to one embodiment of the present invention, it is possible to realize a potential comparator and a test apparatus with a simple configuration by deriving a magnitude relation between predetermined first and second divided voltages generated by means of electric potentials of a first and a second signals forming a differential signal and deriving a magnitude relation between a potential difference between differential signals and a predetermined threshold potential, without performing a complicated process such as analog subtraction method.

What is claimed is:

1. A potential comparator that derives a magnitude relation between a potential difference between a first and a second signals forming a differential signal and a predetermined threshold potential, the potential comparator comprising:

a potential comparing section that derives a magnitude relation between two electric potentials that are objects to be compared;

a first divided-voltage generating section that generates a first divided voltage, which is a divided voltage between a predetermined first electric potential and an electric potential of the first signal, and outputs the first divided voltage as one of the objects to be compared in the potential comparing section; and a second divided-voltage generating section that generates a second divided voltage, which is a divided voltage between i) a second electric potential determined on the basis of the first electric potential and the predetermined threshold potential and ii) an electric potential of the second signal, a magnitude relation between the first divided voltage and the second divided voltage corresponding to a magnitude relation between the potential difference between the first and the second signals and the predetermined threshold potential, and outputs the second divided voltage as the other of the objects to be compared in the potential comparing section.

2. The potential comparator as claimed in claim 1, wherein the first divided-voltage generating section includes a first potential supply source for supplying the first electric potential and a first and a second resistive parts sequentially arranged between the first potential supply source and an input wire for transmitting the first signal and outputs the first divided voltage from a connected portion between the first and the second resistive parts, the second divided-voltage generating section includes a second potential supply source for supplying the second electric potential and a third and a fourth resistive parts, which are sequentially arranged between the second potential supply source and an input wire for transmitting the second signal and have a resistance ratio equal to that between the first and the second resistive parts, and outputs the second divided voltage from a connected portion between the third and the fourth resistive parts, and the second potential supply source supplies an electric potential as the second electric potential, in which a differential value between the supplied electric potential and the first electric potential becomes a value that is obtained by multiplying a value obtained by dividing a resistance value of the third resistive part by a resistance value of the fourth resistive part by the threshold potential.

3. The potential comparator as claimed in claim 2, wherein the resistance ratio between the first and the second resistive parts and the resistance ratio between the third and the fourth resistive parts are 2:1, the first potential supply source supplies an electric potential having a value obtained by subtracting the predetermined threshold potential from a predetermined reference potential as the first electric potential, and the second potential supply source supplies an electric potential having a value obtained by adding the threshold potential to the predetermined reference potential as the second electric potential.

4. The potential comparator as claimed in claim 3, wherein the second and the fourth resistive parts are formed of resistance elements having the same structure and having the same resistance value, and the first and the third resistive parts are formed by serially connecting two of the resistance elements.

5. The potential comparator as claimed in claim 1, wherein characteristic impedances of input wires for the first signal and the second signal match with resistance elements respectively connected to the input wires.

6. A test apparatus that tests a characteristic of an electronic circuit on the basis of a comparison result of a potential comparator that derives a magnitude relation between a potential difference between a first and a second signals forming a differential signal and a predetermined threshold potential, the potential comparator comprising:
- a potential comparing section that derives a magnitude relation between two electric potentials that are objects to be compared;
- a first divided-voltage generating section tat generates a first divided voltages, which is a divided voltage between a predetermined first electric potential and an electric potential of the first signal and outputs the first divided voltage as one of the objects to be compared in the potential comparing section; and
- a second divided-voltage generating section that generates a second divided voltage, which is a divided voltage between i) a second electric potential determined on the basis of the first electric potential and the predetermined threshold potential and ii) an electric potential of the second signal, a magnitude relation between the first divided voltage and the second divided voltage corresponding to a magnitude relation between the potential difference between the first and the second signals and the predetermined threshold potential, and outputs the second divided voltage as the other of the objects to be compared in the potential comparing section.

7. The test apparatus as claimed in claim 6, wherein
the first divided-voltage generating section includes a first potential supply source for supplying the first electric potential and a first and a second resistive parts sequentially arranged between the first potential supply source and an input wire for transmitting the first signal and outputs the first divided voltage from a connected portion between the first and the second resistive parts,
the second divided-voltage generating section includes a second potential supply source for supplying the second electric potential and a third and a fourth resistive parts, which are sequentially arranged between the second potential supply source and an input wire for transmitting the second signal and have a resistance ratio equal to that between the first and the second resistive parts, and outputs the second divided voltage from a connected portion between the third and the fourth resistive parts, and
the second potential supply source supplies an electric potential as the second electric potential, in which a differential value between the supplied electric potential and the first electric potential becomes a value that is obtained by multiplying a value obtained by dividing a resistance value of the third resistive part by a resistance value of the fourth resistive part by the threshold potential.

8. The test apparatus as claimed in claim 7, wherein
the resistance ratio between the first and the second resistive parts and the resistance ratio between the third and the fourth resistive parts are 2:1,
the first potential supply source supplies an electric potential having a value obtained by subtracting the predetermined threshold potential from a predetermined reference potential as the first electric potential, and
the second potential supply source supplies an electric potential having a value obtained by adding the predetermined threshold potential to the predetermined reference potential as the second electric potential.

9. The test apparatus as claimed in claim 8, wherein
the second and the fourth resistive parts are formed of resistance elements having the same structure and having the same resistance value, and
the first and the third resistive parts are formed by serially connecting two of the resistance elements.

10. The test apparatus as claimed in claim 6, wherein characteristic impedances of input wires for the first signal and the second signal match with resistance elements respectively connected to the input wires.

* * * * *